United States Patent
Nagey et al.

(10) Patent No.: US 10,643,568 B2
(45) Date of Patent: *May 5, 2020

(54) MULTI-MODE LOW CURRENT DUAL VOLTAGE SELF-REGULATED LCD PUMP SYSTEM

(71) Applicant: Microchip Technology Incorporated, Chandler, AZ (US)

(72) Inventors: Peter K. Nagey, Tempe, AZ (US); Mudit Gupta, Tempe, AZ (US); Huamin Zhou, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/408,593

(22) Filed: May 10, 2019

(65) Prior Publication Data
US 2019/0266973 A1 Aug. 29, 2019

Related U.S. Application Data

(63) Continuation of application No. 15/621,786, filed on Jun. 13, 2017, now Pat. No. 10,332,476.

(60) Provisional application No. 62/349,825, filed on Jun. 14, 2016.

(51) Int. Cl.
| | |
|---|---|
| *G09G 3/36* | (2006.01) |
| *G09G 3/18* | (2006.01) |
| *H02M 3/07* | (2006.01) |
| *H03K 19/00* | (2006.01) |
| *G09G 3/20* | (2006.01) |
| *G06F 9/22* | (2006.01) |

(52) U.S. Cl.
CPC .............. *G09G 3/3696* (2013.01); *G06F 9/22* (2013.01); *G09G 3/18* (2013.01); *G09G 3/2096* (2013.01); *H02M 3/07* (2013.01); *H03K 19/0016* (2013.01)

(58) Field of Classification Search
None
See application file for complete search history.

(56) References Cited

U.S. PATENT DOCUMENTS

| | | | |
|---|---|---|---|
| 5,397,928 A | 3/1995 | Chan et al. | 307/109 |
| 6,198,342 B1 | 3/2001 | Kawai | 327/536 |
| 9,729,048 B2 | 8/2017 | Crandall et al. | |
| 2009/0049319 A1 | 2/2009 | Meynants | 713/322 |
| 2009/0160534 A1 | 6/2009 | Jansen | 327/536 |
| 2010/0328286 A1 | 12/2010 | Piasecki et al. | 345/211 |
| 2016/0294280 A1 | 10/2016 | Akaho | 327/536 |

OTHER PUBLICATIONS

PCT Invitation to Pay Additional Fees, Application No. PCT/US2017/037362, 13 pages, Aug. 21, 2017.

(Continued)

*Primary Examiner* — Cassandra F Cox
(74) *Attorney, Agent, or Firm* — Slayden Grubert Beard PLLC

(57) ABSTRACT

A bias voltage generator circuit may include a mode control circuit, a clock generator circuit coupled with the mode control unit and configured to generate a plurality of clock signals, and a charge pump circuit configured to receive the clock signals. The charge pump circuit may be coupled with the mode control circuit and operable to output selectable output voltages according to input from the mode control circuit. The output selectable voltages may depend upon the clock signals.

24 Claims, 11 Drawing Sheets

(56) References Cited

OTHER PUBLICATIONS

Kim, Insoo et al., "Sample & Hold Circuits CSE 577," Pennsylvania State University, URL: http://www.cse.psu.edu/-kxc104/class/cse577/11s/lec/S07SampleHold.pdf, 5 pages, Mar. 14, 2011.

Liu, Weicheng et al., "Enhanced Level Shifter for Multi-Voltage Operation," IEEE, URL: http://www.ece.sunysb.edu/-emre/papers/07168915.pdf, 4 pages, Dec. 31, 2015.

International Search Report and Written Opinion, Application No. PCT/US2017/037362, 19 pages, dated Oct. 13, 2017.

| PUMP MODE | GAIN | 3V/5V | LC | V3_en | V2_en | V1_en | V3 | V2 | V1 |
|---|---|---|---|---|---|---|---|---|---|
| 3.0 GLASS (2-PHASE) | 3 | 0 | 0 | 0 | 1 | 0 | Vlcd2 | Vlcd1 | Vin |
| 5.0 GLASS (3-PHASE) | 4 | 1 | 0 | 1 | 0 | 0 | Vlcd3 | Vlcd2 | Vlcd1 |
| 3.0 GLASS LC(1-PHASE) | 2 | 0 | 1 | 0 | 0 | 1 | Vlcd1 | Vin | Vin |
| 5.0 GLASS LC(2-PHASE) | 3 | 1 | 1 | 0 | 1 | 1 | Vlcd2 | Vlcd1 | Vin |

FIG. 3

| PUMP MODE | GAIN | 3V/5V | LC | V3 | V2 | V1 | CURRENT |
|---|---|---|---|---|---|---|---|
| 3.0 GLASS (2-PHASE) | 3 | 0 | 0 | 3*Vin | 2*Vin | 1*Vin | 0.412uA |
| 5.0 GLASS (3-PHASE) | 4 | 1 | 0 | 4*Vin | 3*Vin | 2*Vin | 0.834uA |
| 3.0 GLASS LC(1-PHASE) | 2 | 0 | 1 | 2*Vin | 1*Vin | 1*Vin | 0.218uA |
| 5.0 GLASS LC(2-PHASE) | 3 | 1 | 1 | 3*Vin | 2*Vin | 1*Vin | 0.561uA |

FIG. 4

MULTI-MODE LOW CURRENT DUAL VOLTAGE SELF-REGULATED LCD PUMP SYSTEM

CROSS-REFERENCE TO RELATED APPLICATIONS

This application is a continuation of U.S. application Ser. No. 15/621,786 filed on Jun. 13, 2017, and claims the benefit of U.S. Provisional Application No. 62/349,825, filed on Jun. 14, 2016, which is incorporated herein in its entirety.

RELATED PATENT APPLICATION

This application claims priority to commonly owned U.S. Provisional Patent Application No. 62/349,825; filed Jun. 14, 2016; which is hereby incorporated by reference herein for all purposes.

TECHNICAL FIELD

The present disclosure relates to liquid crystal display (LCD) bias voltage generators and, in particular, generators suitable for microcontroller integration.

PRIORITY

The present application depends from U.S. Provisional Application 62/349,825, filed Jun. 14, 2016, the contents of which are hereby incorporated.

BACKGROUND

Microcontrollers are systems on a chip that comprise a microprocessor, memory, and a plurality of integrated peripheral devices. A wide variety of microcontrollers such as 8-bit, 16-bit, and 32-bit microcontrollers are available. Many microcontrollers comprise integrated liquid crystal display (LCD) interfaces that are capable of driving a wide variety of displays. Thus, no external controllers are necessary to interface with such displays.

To be able to directly drive an LCD display, such an integrated peripheral needs a voltage bias generator suitable to generate the bias voltage needed to operate the LCD. LCD bias generators are mainly targeted for 3V LCD panels, while there are legacy 5V LCD panels still in use. Microcontrollers that support both 3V and 5V LCD panels utilize two separate pumps.

BRIEF DESCRIPTION OF THE DRAWINGS

For better understanding and illustration of the present disclosure, the following drawings are included.

FIGS. 3 and 4 illustrate operation of a pump circuit and associated system with respect to various modes of operation, according to embodiments of the present disclosure.

SUMMARY

Figure 1:
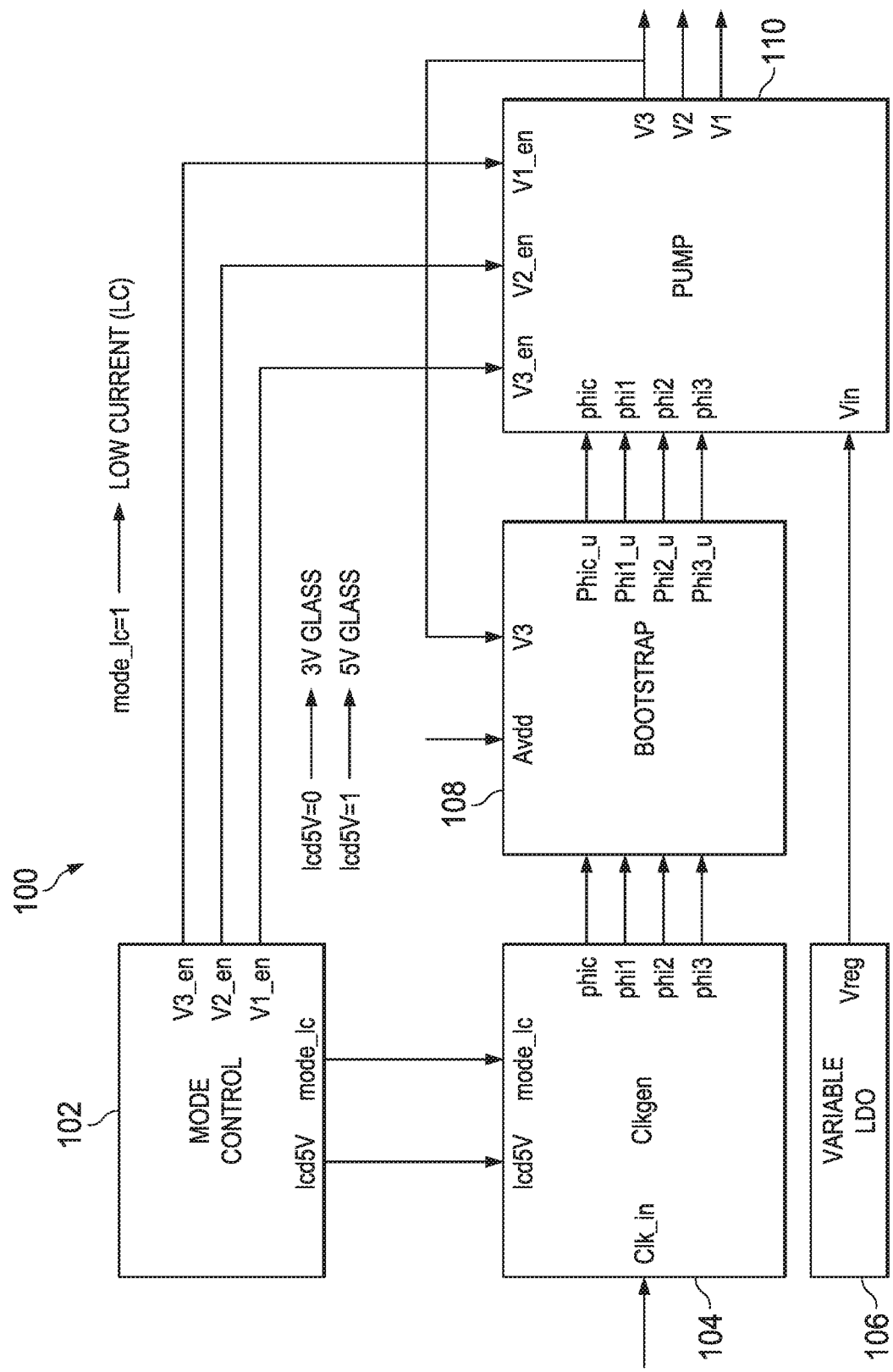
FIG. 1 is an illustration of an example embodiment of a system capable of providing power to or driving two or more different kinds of displays or other electronic devices that are powered using a pump source, according to embodiments of the present disclosure.

Embodiments of the present disclosure include a bias voltage generator circuit. The bias voltage generator circuit may include a mode control circuit, a clock generator circuit coupled with the mode control unit and configured to generate a plurality of clock signals, and a charge pump circuit configured to receive the clock signals. The charge pump circuit may be coupled with the mode control circuit and operable to output selectable output voltages according to input from the mode control circuit. The output selectable voltages may depend upon the clock signals.

In combination with any of the above embodiments, the bias voltage generator circuit may further include a bootstrap circuit coupled between the clock generator circuit and the charge pump circuit.

In combination with any of the above embodiments, the mode control circuit may be configured to select between a plurality of operating modes defining output of the charge pump circuit.

In combination with any of the above embodiments, a first operating mode may be configured to provide for a bias voltage for a 3V LCD and a second operating mode is configured to provide for a bias voltage for a 5V LCD.

In combination with any of the above embodiments, a first operating mode may be configured to provide for a bias voltage with a first current for an LCD and a second operating mode is configured to provide the bias voltage with a second current for the LCD.

In combination with any of the above embodiments, the clock signals may include non-overlapping pulses of a base signal and a plurality of phased signals, the phased signals selected according to specified output of the charge pump circuit.

In combination with any of the above embodiments, the clock signals may include non-overlapping pulses of a base signal and one or more phased signals, and the charge pump circuit is configured to output bias voltages based upon the presence of alternating ones of the phased signals.

In combination with any of the above embodiments, the clock signals may include non-overlapping pulses of a base signal and one or more phased signals, the charge pump circuit may be configured to output a first voltage based upon the presence of a first number of different phased signals, the charge pump circuit may be configured to output a second voltage based upon the presence of a second number of different phased signals, the second voltage may be higher than the first voltage, and the second number of different phased signals may be greater than the first number of different phased signals.

In combination with any of the above embodiments, the clock signals may include non-overlapping pulses of a base signal and one or more phased signals, and the charge pump circuit may be configured to output a voltage based on a number of different phased signals.

In combination with any of the above embodiments, the clock signals may include non-overlapping pulses of a base signal and one or more phased signals, and the charge pump circuit may be configured to output a bias voltage with a current, the current based upon a number of different phased signals.

Embodiments of the present disclosure may include a microcontroller with a bias voltage generator circuit and an output routing circuit configured to route output from the bias voltage generator circuit to a display, wherein the bias voltage generator circuit is implemented by any of the embodiments described above.

DETAILED DESCRIPTION

FIG. 1 is an illustration of an example embodiment of a system 100 capable of providing power to or driving two or more different kinds of displays or other electronic devices that are powered using a pump source. System 100 may include a voltage or current pump source to power the two or more different kinds of displays. In one embodiment, the ability to power two or more different kinds of displays may represent corresponding modes of a pump in system 100. In another embodiment, system 100 may be configured to provide power through its pump at different voltages, wherein different displays require different voltage levels, and different voltages are provided in different modes. In yet another embodiment, system 100 may be configured to provide a given voltage at different current levels to a given display, wherein different current levels at the given voltage are provided in different modes. In another embodiment, system 100 may be self-regulating.

System 100, through its pumps, may provide any suitable voltage to a display or other peripheral device. The voltages may include bias voltages. In one embodiment, system 100 may be configured to provide voltage to power a liquid crystal display (LCD). In another embodiment, system 100 may be configured to provide power to two or more different kinds of LCDs. In a further embodiment, system 100 may be configured to provide power to two or more different kinds of displays through a single pump. In another, further embodiment, system 100 may be configured to provide power to two or more different kinds of displays through a single pump by providing multiple voltage levels and multiple current levels at a given voltage through the single pump. In one embodiment, system 100 may be configured to be able to switch between providing power to the different kinds of display. In a further embodiment, system 100 may be configured to switch between providing power to different kinds of display in response to commands, settings, or other input from a further system in which system 100 is implemented, such as commands or control from a microcontroller.

Other approaches to providing voltages to multiple types of displays, in contrast, may utilize two separate pumps for supporting display panels with different voltages. Using two separate pumps may occupy a large die area on a semiconductor device. Hence, system 100 may provide an improved bias voltage generator.

System 100 may be included in any suitable further system, such as a microcontroller, integrated device, system-on-chip, mobile device, etc. System 100 may be implemented in any suitable combination of analog or digital circuitry. Although system 100 is illustrated with example elements, system 100 may include more or fewer elements. Furthermore, some elements of system 100 may be combined with one another. Also, the functionality of some elements of system 100 may be performed by other elements of system 100 as a variation of the examples presented herein.

System 100 may include a pump 110. Pump 110 may be implemented through any suitable combination of analog and digital circuitry. Pump 110 may be configured to selectively generate bias voltages for multiple different types of displays. Furthermore, pump 110 may be configured to generate a given voltage at different current levels. The variations of different outputs of pump 110 may be manifested in different modes of operation of pump 110. Pump 110 may output three different voltage lines that embody the bias voltages that are to be applied to a display—V1, V2, and V3. These may be routed to multiple displays. V1, V2, and V3 may be routed to a specified display using, for example, multiplexers, switches, switch fabric, or other mechanisms, which are not shown.

Pump 110 may determine what bias voltages and currents are to be generated based upon phases of input signals. Furthermore, pump 110 may determine what bias voltages and currents are to be generated based upon enable signals. The phases of input signals and the enable signals may be in turn created by circuitry in system 100 based upon commands or inputs to system 100. In the example of FIG. 1, pump 110 may receive phased input signals phic (phi common), phi1, phi2, and phi3. Furthermore, pump 110 may receive enable signals for V1, V2, and V3, enumerated as V1_en, V2_en, and V3_en.

In the example of FIG. 1, pump 110 may be configured to provide bias voltages to two different kinds of LCD display panels. First, pump 110 may be configured to generate bias voltages for 5V LCD display panels. Second, pump 110 may be configured to generate bias voltages for 3V LCD display panels. Furthermore, pump 110 may be configured to generate the bias voltage for the 5V LCD and 3V LCD display panel at a reduced current level.

System 100 may include a mode control circuit 102 configured to determine what mode operation that pump 110 will operate. Mode control circuit 102 may be implemented by any suitable combination of circuitry, and is discussed in more detail below. Mode control circuit 102 may determine what mode of operation that pump 110 will operate in any suitable manner. For example, mode control circuit 102 may receive a command from a microcontroller, read a register value, identify a jumper setting, receive a digital switch value, user configured circuitry, programmable fuse, memory value, register file, or any other mechanism defining the mode to be used. Based upon the mode identified by mode control circuit 102, mode control circuit 102 may issue a first signal identifying whether, for example, 3V or 5V displays are to be powered. For example, mode control circuit 102 may issue a value on a line denoted lcd5V, wherein a low or 0 value represents a 3V mode and a high or 1 value represents a 5V mode. Furthermore, based upon the mode identified by mode control circuit 102, mode control circuit 102 may issue a first signal identifying whether, for example, a low current mode is to be used in the bias voltage for the display. For example, mode control circuit 102 may issue a value on a line denoted mode_lc, wherein a high or 1 value represents a low current mode and a low or 0 value represents a normal current mode. In addition, depending upon the mode selected, mode control circuit 102 may be configured to issue V1_en, V2_en, and V3_en to pump 110.

V1_en, V2_en, and V3_en may be control signals that inform pump 110 whether system 100 is to operate in 5V mode, 3V mode, or high or low current mode. Referring to FIG. 3, 3V mode pump 110 assigns Vlcd2, Vlcd1, and Vin to V3, V2, and V1, respectively. In 5V mode pump 110 assigns Vlcd3, Vlcd2, and Vlcd1 to V3, V2, and V1, respectively. In 3V mode LC pump 110 assigns Vlcd3, Vin, and Vin to V3, V2, and V1, respectively. Finally, in 5V mode pump 110 assigns Vlcd3, Vlcd2, and Vin to V3, V2, and V1, respectively. Whenever pump 110 assigns Vin to outputs V3, V2, and V1, it connects LDO 106 output to outputs V3, V2, and V1. Chold caps 220, 222, 224 are required for operation of pump 110, where they act as charge reservoirs for pump 110 to supply instantaneous and dynamic currents of an LCD display. When pump 110 assigns Vin to V1 Chold 224 can be removed. Assignment of Vin to V2 allows removal of Chold 222. Chold capacitors 220, 222, and 224 are placed off chip on a printed circuit board. Hence, their removal saves space and lowers the Build Of Material (BOM) cost Returning to FIG. 1, system 100 may include a clock generation circuit 104 configured to generate phased signals as inputs to pump 110. The phased signals may be the basis for pump 110 generating bias voltages for a selected one of the 3V and 5V display. Clock generation circuit 104 may accept as input a system clock signal. Clock generation circuit 104 may be configured to generate phic, phi1, phi2, and phi3 signals. Clock generation circuit 104 may be configured to determine the contents of phic, phi1, phi2, and phi3 signals based upon input from mode control circuit 102. The phic, phi1, phi2, and phi3 signals may be routed for additional signal conditioning before being applied to pump 110. Clock generation circuit 104 may be implemented in any suitable combination of circuitry, and is discussed in more detail below. The contents of the phic, phi1, phi2, and phi3 signals are also discussed in more detail below. Clock generation circuit 104 may transform its external clock input into the phic signal and one or more of phi1, phi2, and phi3. Phic signal may always be generated and used by pump 110. Generation of specific ones of phi1, phi2, and phi3, and the use thereof by pump 110, may depend upon the selected mode of operation. Phi1, phi2, and phi3 may each have different phases and periods than each other and phic. Phi1, phi2, and phi3 might each be used or discarded depending upon the mode.

System 100 may include a bootstrap circuit 108. Bootstrap circuit 108 may be configured to ensure that voltage levels of phic, phi1, phi2, and phi3 signals as received at pump 110 are at expected levels or ranges of levels. Pump 110 may be configured to perform as a buck-boost element, and thus always output a constant level (such as, for example, 3V or 5V) even when the system degrades. Thus, if the system degrades, pump 110 may compensate and continue to output at a constant level of 3V or 5V. In order to assist pump 110 in compensating, if necessary, bootstrap circuit 108 may help ensure that pump 110 receives consistent input with respect to the expected levels of phic, phi1, phi2, and phi3 signals. Bootstrap circuit 108 may output phic_u, phi1_u, phi2_u, and signals, designated as boosted or up-conditioned (if necessary) versions of phic, phi1, phi2, and phi3 signals. These may be input to pump 110. Bootstrap circuit 108 may include a system voltage input Avdd. In one embodiment, an output V3 of pump 110 may be routed to bootstrap circuit 108 as an input. Bootstrap circuit 108 may use the V3 value, an output of pump 110, to determine whether to adjust the phased signals for pump 110. Bootstrap circuit 108 may be implemented in any suitable combination of circuitry and is discussed in more detail below.

System 100 may include a voltage regulator to provide a constant reference voltage to pump 110. For example, system 100 may include a variable low dropout (LDO) voltage regulator, such as LDO 106. LDO 106 may be configured to output a constant reference voltage to pump 110. In one embodiment, LDO 106 may receive V3 from pump 110 as a feedback input. In another embodiment, LDO 106 may be a variable LDO as it calibrates the output to the pump according to voltage bias needs. For example, as output of pump 110 varies from a desired 3V output, LDO 106 may be configured to adjust the reference voltage to bring the output of pump 110 back to the desired 3V output. LDO 106 may receive its own power supply from a chip on which system 100 resides. LDO 106 may be implemented in any suitable combination of analog and digital circuitry.

The gain of pump 110 may be controlled by the number of clock phases received through phi1, phi2, and phi3, which are evaluated in view of phic. The output of pump 110 may be reordered according to the inputs from mode control circuit 102. LDO 106 may dial-in and calibrate output of pump 110. The levels of clock phases phic, phi1, phi2, and phi3 may be monitored and adjusted or normalized as necessary by bootstrap circuit 108.

Figure 2:
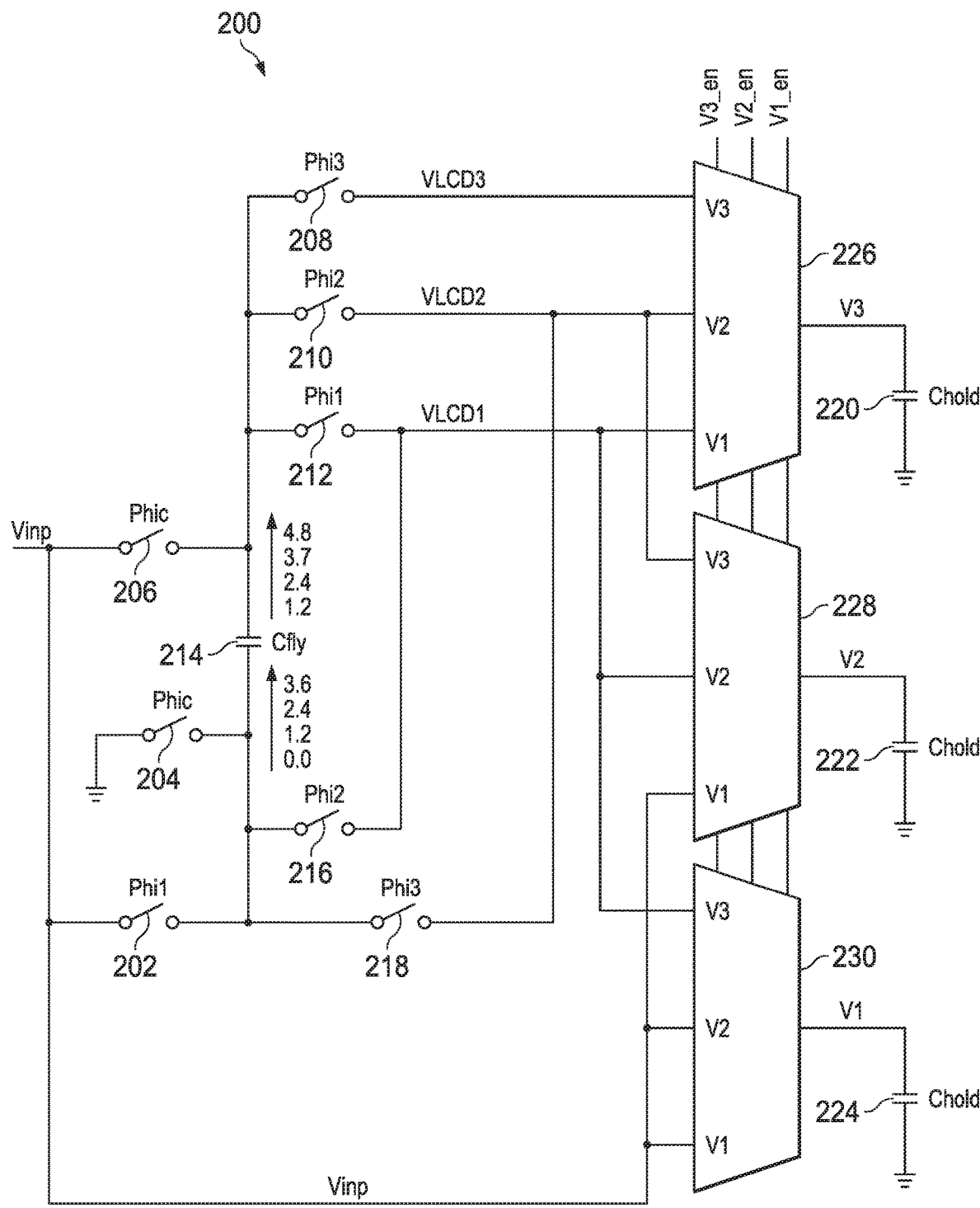
FIG. 2 illustrates an example embodiment of a pump circuit, according to embodiments of the present disclosure.

FIG. 2 illustrates an example embodiment of a pump circuit 200, according to embodiments of the present disclosure. Pump circuit 200 may fully or in part implement pump 110. Pump circuit 200 may include a plurality of switches 202, 204, 206, 208, 210, 212, 216, 218 each connected to one of input signals phic, phi1, phi2, and phi3. Pump circuit 200 may include a fly capacitor, Cfly 214. Intermediate signals in pump circuit 200 may include those designated in FIG. 2 as VLCD3, VLCD2, and VLCD1, Vinp. Each of these VLCD3, VLCD2, and VLCD1, and Vinp intermediate signals may be connected to each of multiplexers 226, 228, 230. The control of multiplexers 226, 228, 230 may each be performed by the V1_en, V2_en, and V3_en signals received at pump 110. The enable signals may select which of VLCD3, VLCD2, VLCD1, and Vinp will be routed as the V3, V2, and V1 outputs. The V3, V2, and V1 outputs may each be made across a hold capacitor 220, 222, 224, which may be accepted as bias voltages to the inputs of the displays. These may be optionally eliminated depending upon the mode, as discussed above.

Operation of pump circuit 200 may be illustrated through timing diagrams, described in more detail below. Pump circuit 200 may be configured to, through timing and phases of phic, phi1, phi2, and phi3, to pump up voltage from Vinp (received from the LDO) to an appropriate level expected by a given display. The level to which voltage is pumped may be determined through the enable signals received at pump circuit 200. Moreover, the voltage levels may be multiples of the input voltage.

Pump circuit 200 may operate on the principle of the conservation of charge as different phases of phic, phi1, phi2, and phi3 are applied through their respective circuits to Cfly 214. At an initial point, phic may be applied across Cfly 214. Cfly 214 may then be initialized or charged to the output of the LDO, such as 1.2V. Thus, the top charge of Cfly 214 may be 1.2V while the bottom is 0.0V. Next, if phi1 goes high, the top charge of Cfly 214 may be 2.4V and the bottom may be 1.2V. Thus, the voltage may be bumped or pumped. This may be performed while phic is off. Depending upon the mode, this may be repeated until the interim signal voltages VLCD3, etc. are one of 4.8, 3.6, 2.4, and 1.2 V. Depending upon the mode, these are output to the hold capacitors. The bottom hold capacitor might be unnecessary for 3V mode.

FIGS. 3 and 4 illustrate operation of pump circuit 200 and system 100 with respect to various modes of operation, according to embodiments of the present disclosure. Control signals and resulting output voltages and currents are shown therein. Entries in FIG. 3 denoted as "VIN" indicate an output wherein a capacitor need not be used when connecting voltage outputs to a panel as such a capacitor is not needed for storage to properly regulate the output signal in such a particular situation. In such situations, the capacitor that need not be used (such as one of Cholds 220, 222, 224) can be removed from an implementation.

Figure 5:
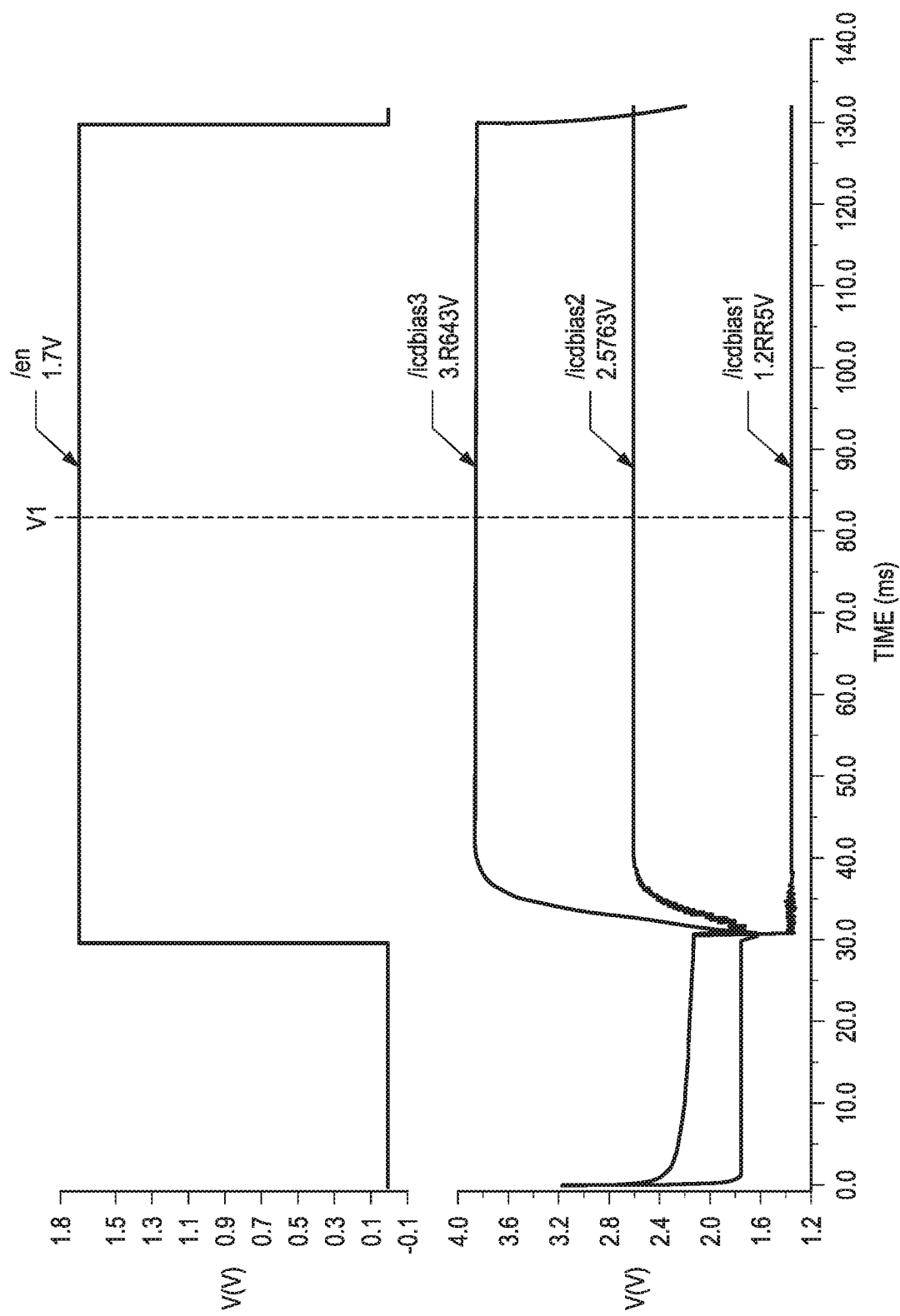
FIG. 5 illustrates a timing diagram of output signals of a pump circuit, according to embodiments of the present disclosure.

FIG. 5 illustrates a timing diagram of output signals of pump circuit 200, according to embodiments of the present disclosure. Once a particular mode, such as a 3V mode, has been enabled (denoted by the/en trace), outputs of pump circuit 200 may be stable within approximately 10 ms. The outputs may include V1, V2, V3 denoted by the /lcdbias1, /lcdbias2, and/lcdbias3 traces.

Figure 6:
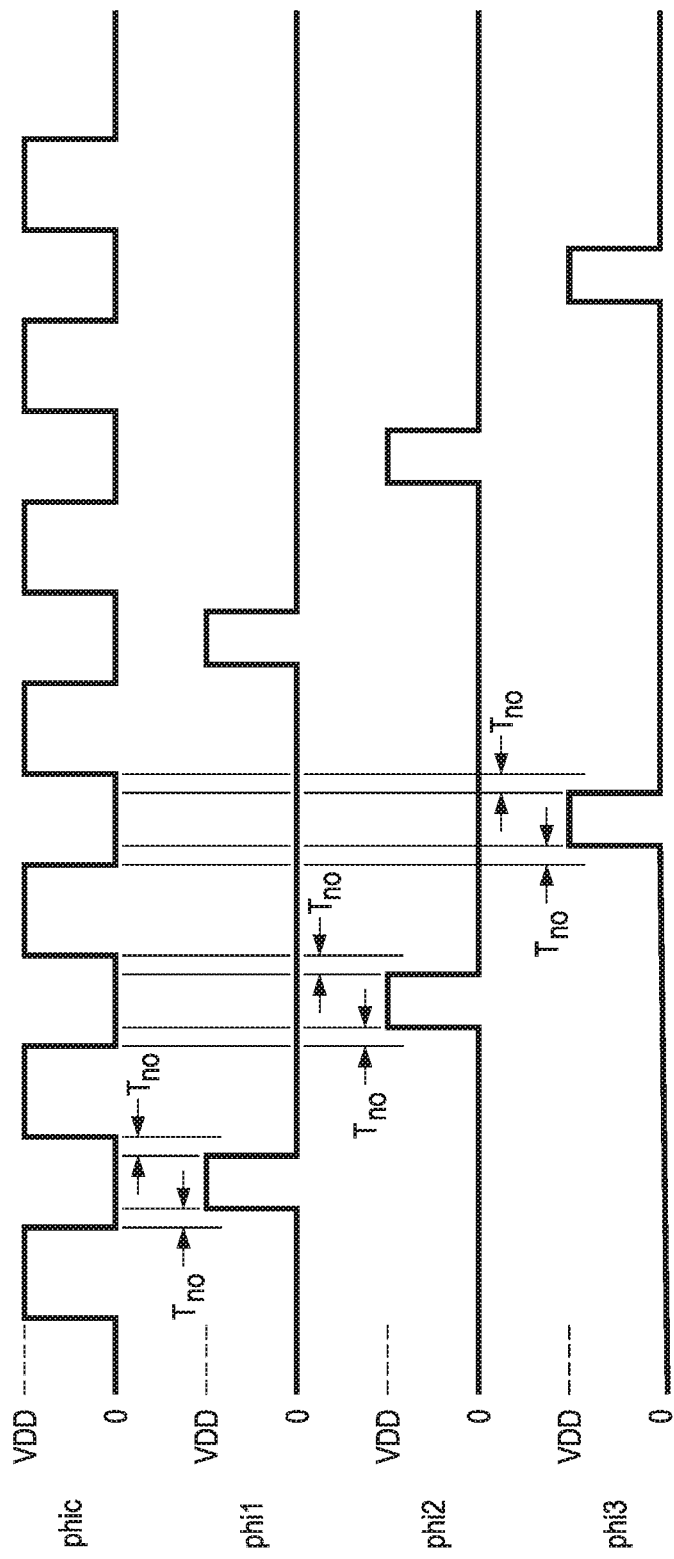
FIG. 6 illustrates a timing diagram of output of a clock generator circuit in a 3-phase mode, according to embodiments of the present disclosure.

FIG. 6 illustrates a timing diagram of output of clock generator circuit 104 in a 3-phase mode, according to embodiments of the present disclosure. This mode may be used to implement 5V outputs to displays with full current.

Figure 7:
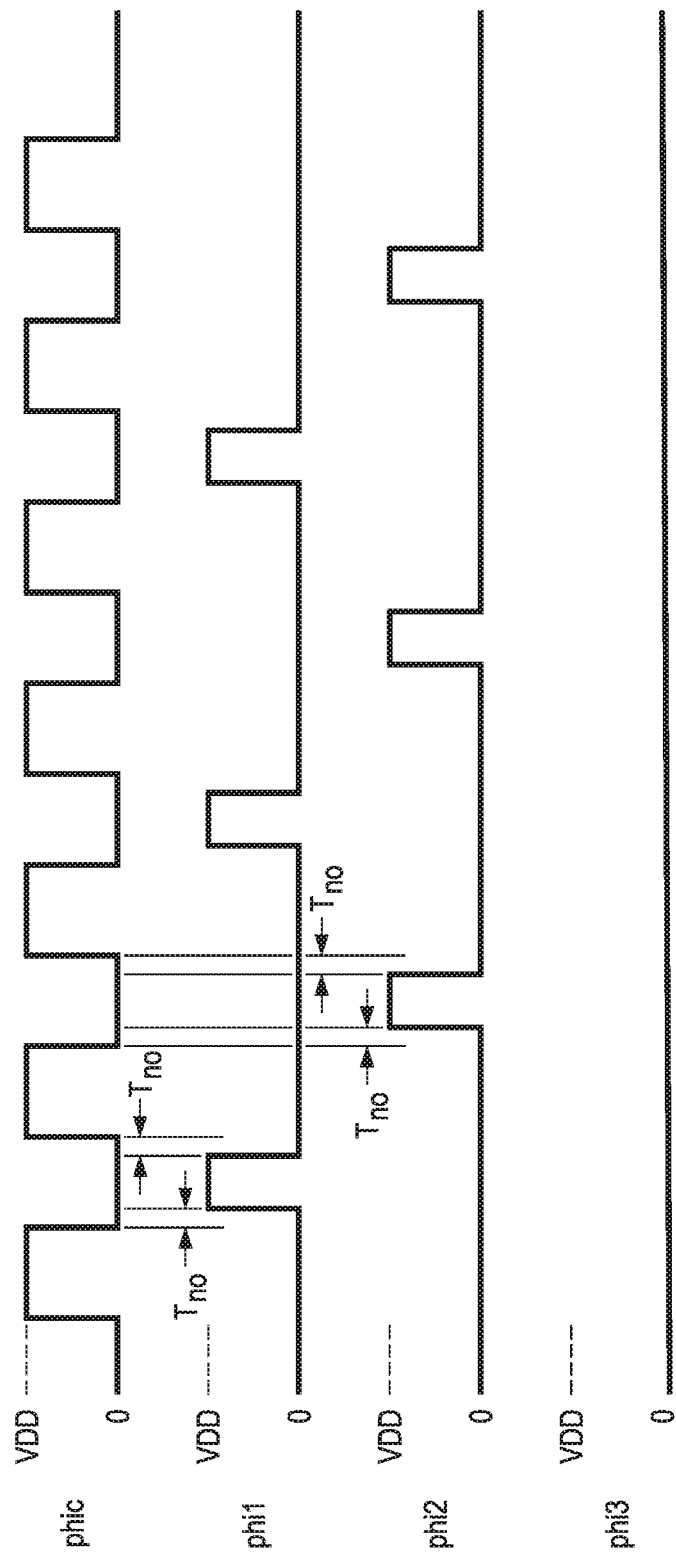
FIG. 7 illustrates a timing diagram of output of a clock generator circuit in a 2-phase mode, according to embodiments of the present disclosure.

FIG. 7 illustrates a timing diagram of output of clock generator circuit 104 in a 2-phase mode, according to embodiments of the present disclosure. This mode may be used to implement 3V outputs to displays with full current or 5V outputs to displays with reduced current.

Figure 8:
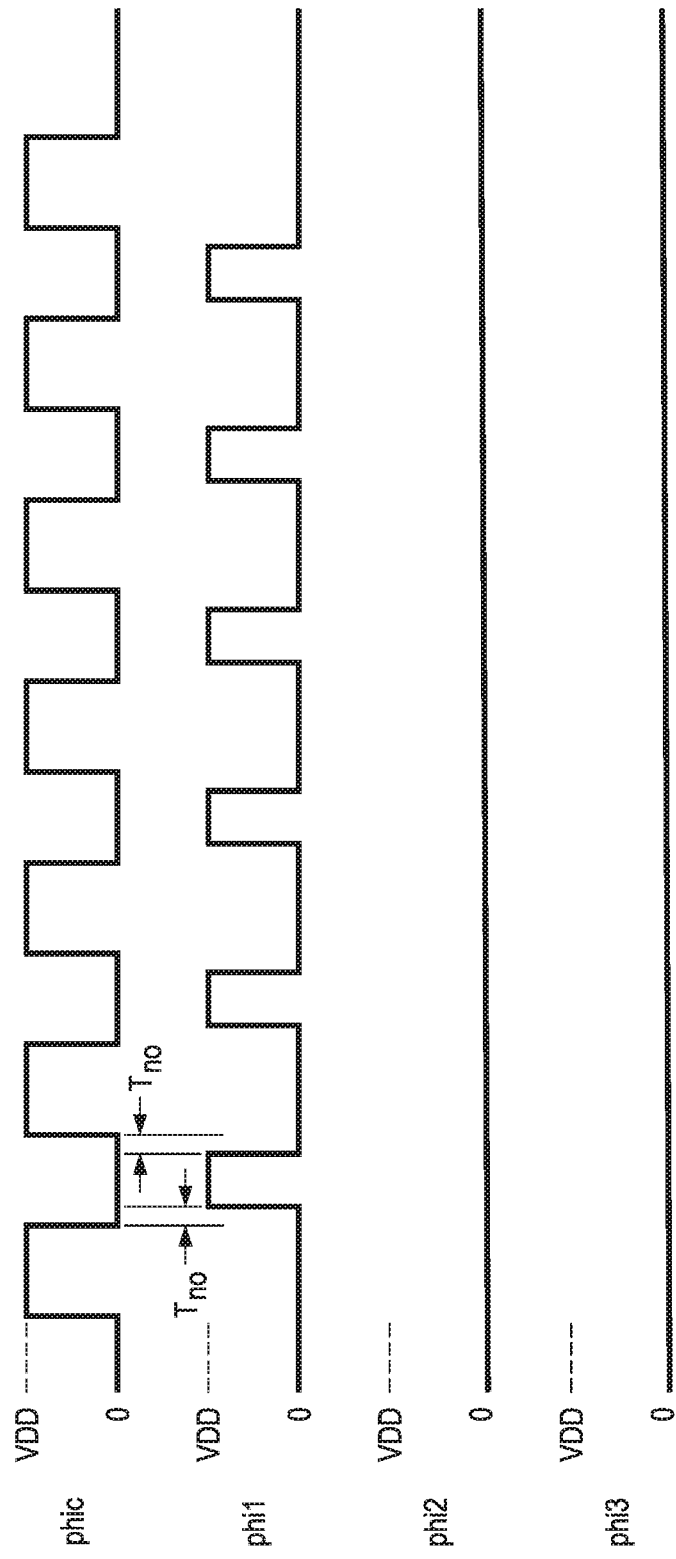
FIG. 8 illustrates a timing diagram of output of a clock generator circuit in a 1-phase mode, according to embodiments of the present disclosure.

FIG. 8 illustrates a timing diagram of output of clock generator circuit 104 in a 1-phase mode, according to embodiments of the present disclosure. This mode may be used to implement 3V outputs to displays with reduced current.

In FIGS. 6-8, clock generator circuit 104 is shown as generated non-overlapping clock signals with a specific phase and frequency relationship between the signals. Specifically, when phic is high, none of phi1, phi2, or phi3 might be high. One of phi1, phi2, and phi3 might be high during a time when phic is low. Phic, phi1, phi2, and phi3 might not overlap. Accordingly, as shown in FIG. 2, only switches associated with one of phic, phi1, phi2, and phi3 might be switched on at any given moment in time. In each period of phic, when phic is low, one of phi1, phi2, and phi3 might be switched on in a non-overlapping manner. The specific ones of which of phi1, phi2, and phi3 that are switched on may depend upon whether clock generator circuit 104 is generating a 1-phase, 2-phase, or 3-phase signal. When clock generator circuit 104 is generating a 3-phase signal, phi1, phi2, and phi3 may be switched on in alternating fashion during parts of the phic period when phic is low, as shown in FIG. 6. When clock generator circuit 104 is generating a 2-phase signal, phi1 and phi2 may be switched on in alternating fashion during parts of the phic period when phic is low, as shown in FIG. 7. When clock generator circuit 104 is generating a 1-phase signal, phi1 may be switched on fashion during parts of the phic period when phic is low, as shown in FIG. 8. Clock generator circuit 104 may be implemented in any suitable manner to generate the signals of FIGS. 6-8 according to the specified mode.

Figure 9:
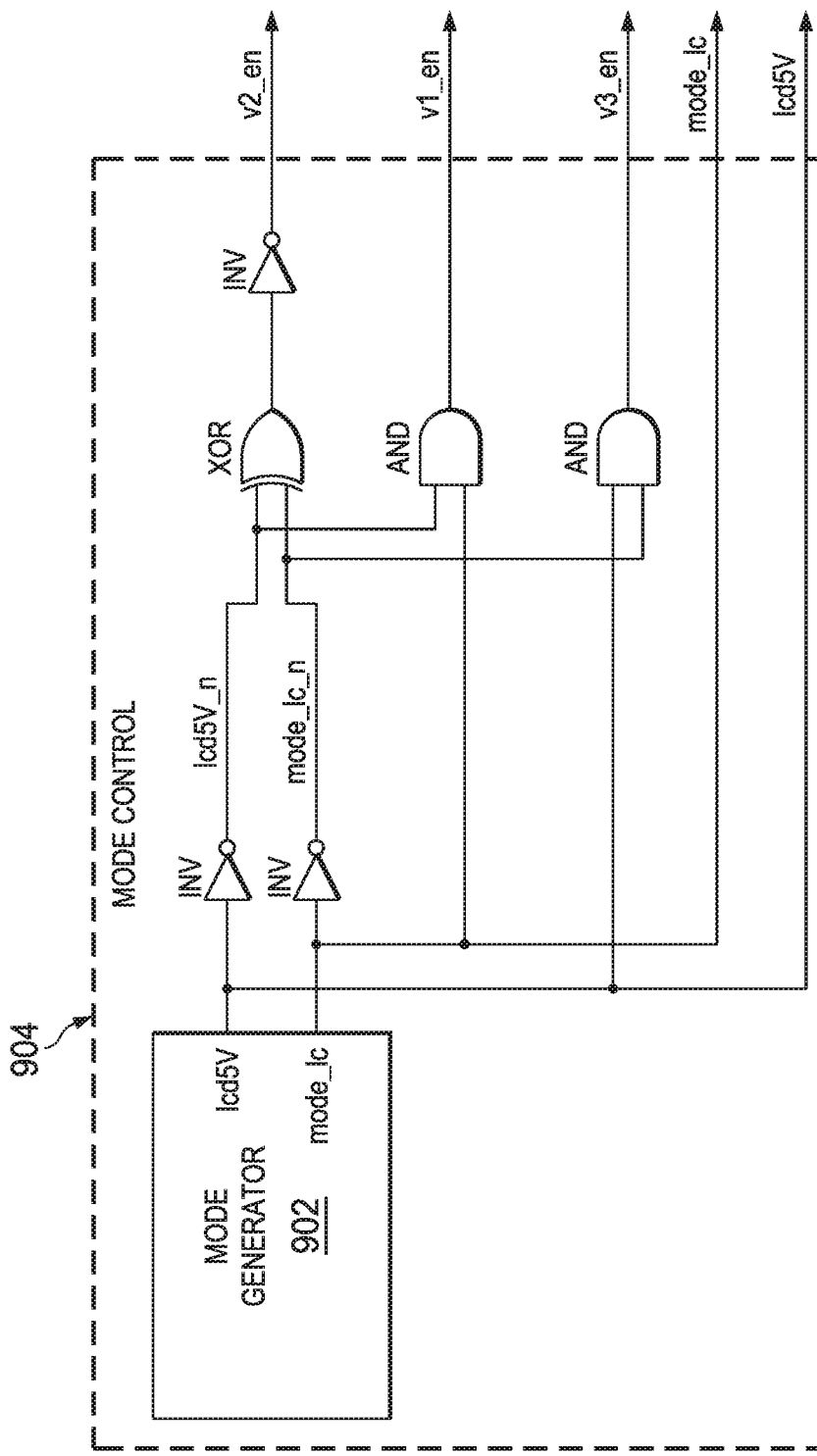
FIG. 9 is a more detailed illustration of a mode control circuit, according to embodiments of the present disclosure.

FIG. 9 is a more detailed illustration of mode control circuit 102, according to embodiments of the present disclosure. Mode control circuit 102 may include a mode generator circuit 902. Mode generator circuit 902 may be configured to directly access the register, jumper, memory, data line, or other input from the rest of system 100 identifying which mode is to be used. Mode generator circuit 902 may issue lcd5V and mode_lc to the rest of system 100 and to digital logic 904. Digital logic 904 may include sufficient elements to interpret the combination of lcd5V and mode_lc into V1_en, V2_en, and V3_en signals. Example logic is shown in FIG. 9. These enable signals may be defined according to the values in FIG. 3.

Figure 10:
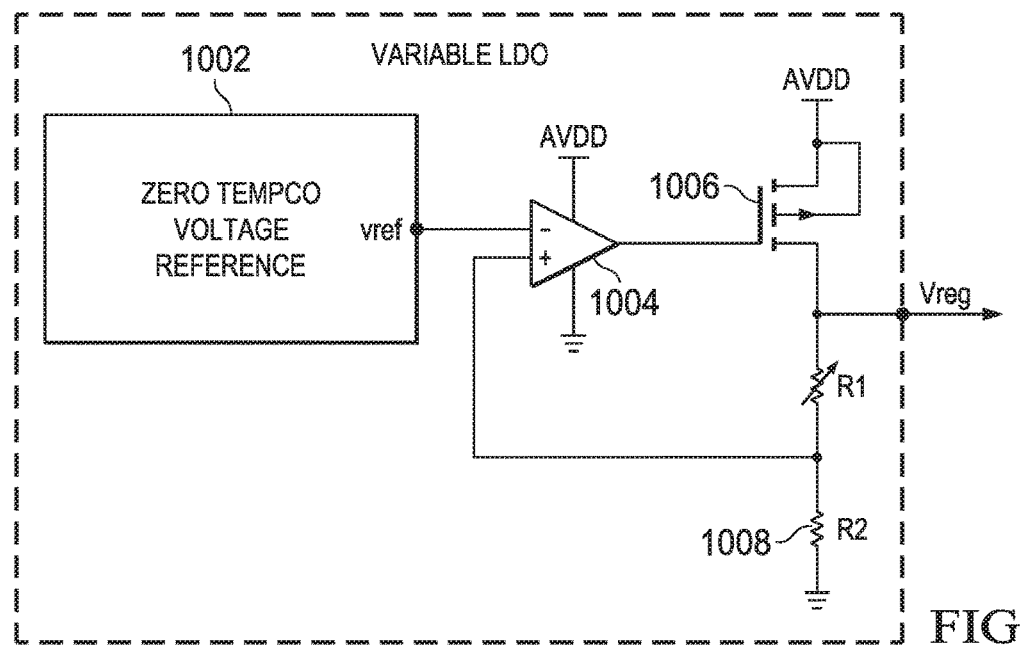
FIG. 10 is a more detailed illustration of a voltage regulator, according to embodiments of the present disclosure.

FIG. 10 is a more detailed illustration of LDO 106, according to embodiments of the present disclosure. LDO 106 may include a voltage reference from system 100, such as a zero-temperature coefficient voltage reference 1002 generating a vref. This may be passed into an op-amp 1004, powered by the Avdd signal and receiving a feedback signal from a resistor network 1008 connected to the output of op-amp 1004. The output of op-amp 1004 may be sent out as Vreg and to the bottom of a transistor 1006 configured as a voltage driver and a top of resistor network 1008. One or more resistors of resistor network 1008 may be variable, allowing LDO 106 to be a variable output LDO with different set values. This may be used, for example, to set the LDO output so as to eventually power a 3V or a 5V display.

Figure 11:
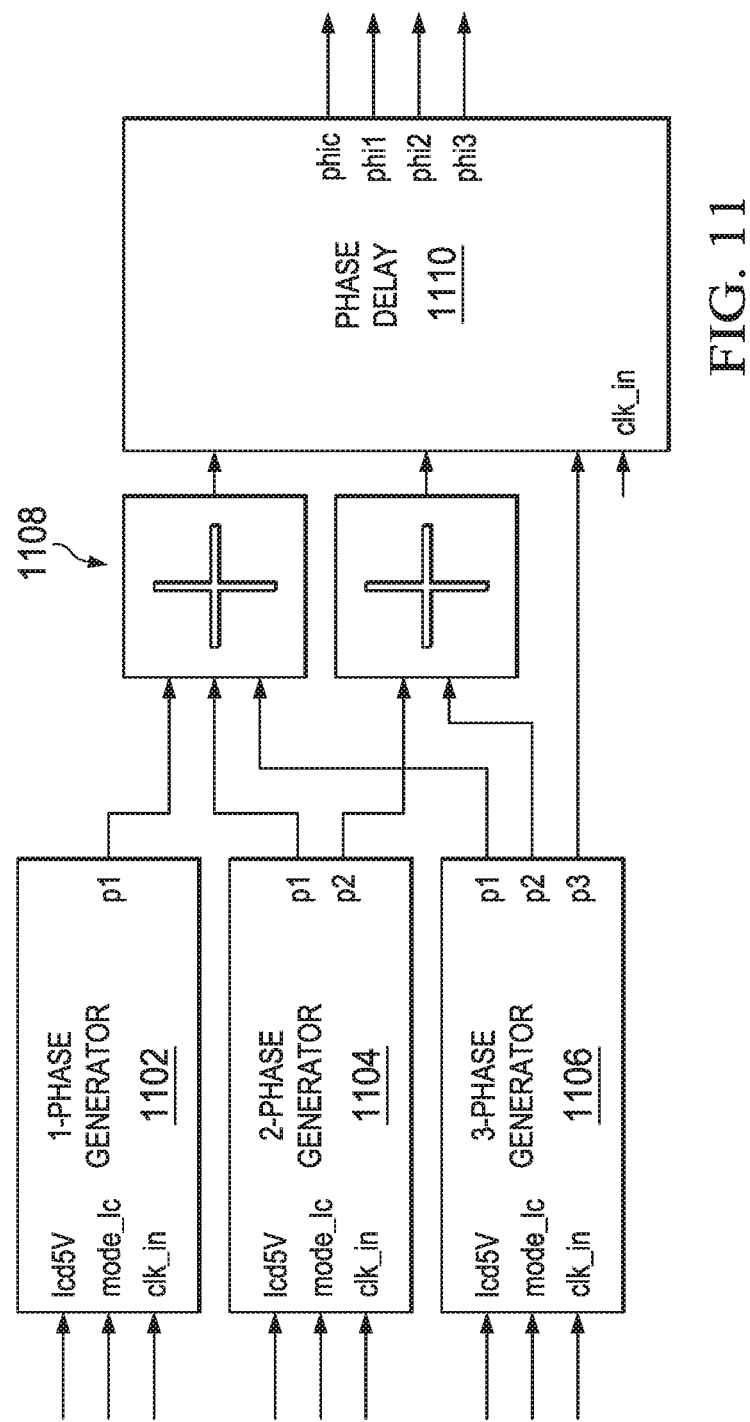
FIG. 11 is a more detailed illustration of a clock generation circuit, according to embodiments of the present disclosure.

FIG. 11 is a more detailed illustration of clock generation circuit 104, according to embodiments of the present disclosure. Clock generator circuit 104 may be configured to generate the timing signals for phic, phi1, phi2, and phi3 according to one of FIGS. 6-8, depending upon input signals lcd5V and mode_lc. These timing signals may be based upon the input clock. Clock generator circuit 104 may include any suitable number of signal generators 1102, 1104, 1106. These signal generators may be configured to generate possible constituents of the phased signals. The output may be combined using summer circuits 1108 and a phase delay circuit 1110 may ensure that the output signals are non-overlapping.

Figure 12:
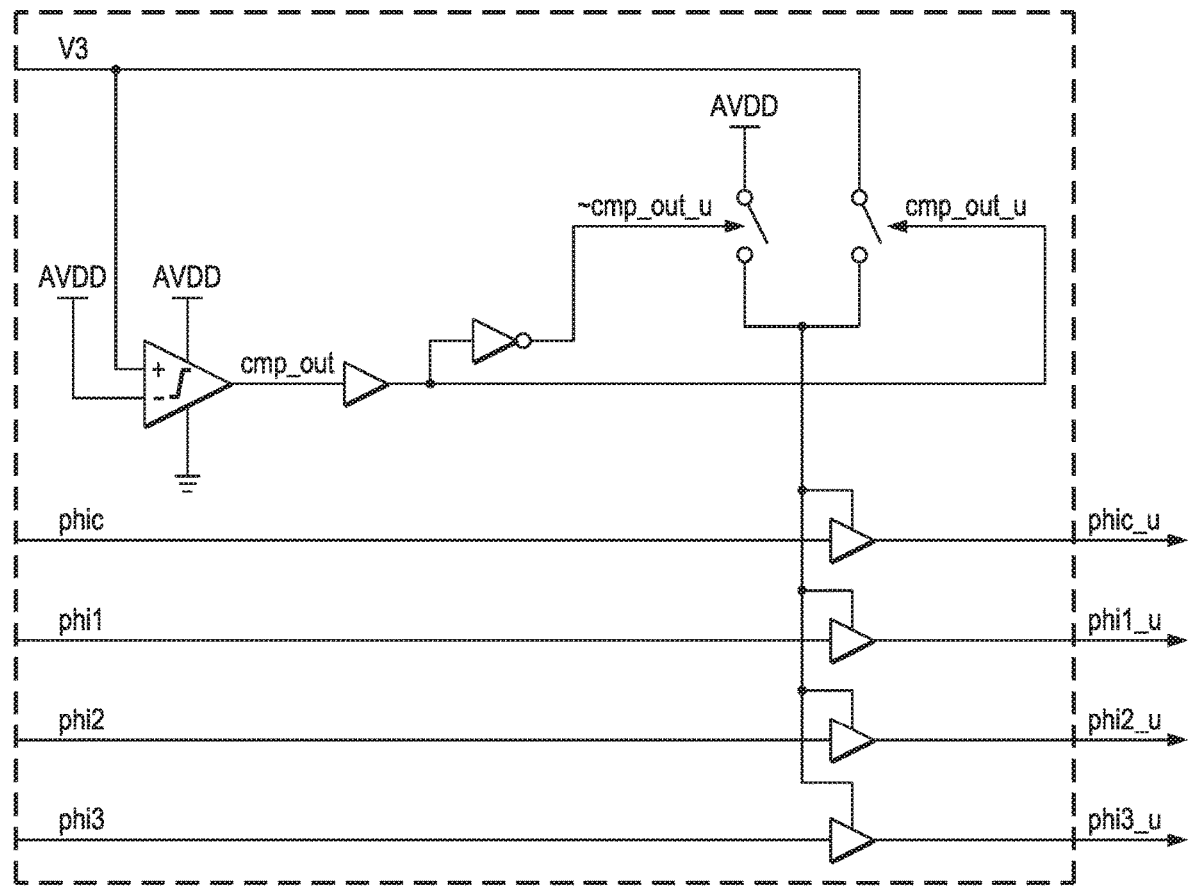
FIG. 12 is a more detailed illustration of a bootstrap circuit, according to embodiments of the present disclosure.

FIG. 12 is a more detailed illustration of bootstrap circuit 108, according to embodiments of the present disclosure. Each of phic, phi1, phi2, and phi3 may be boosted by either the V3 output of the pump or an Avdd voltage value, depending upon which one is greater. Avdd voltage value is set by greater system or user requirements, where a system is typically a microcontroller or similar system. A comparator in bootstrap circuit 108 compares the Avdd against the V3 signal. If Avdd is greater than the V3 signal, then Avdd is added to buffers for phic/phi1/phi2/phi3, and each of phic/phi1/phi2/phi3 is shifted up by Avdd. If Avdd is less than the V3 signal, V3 is switched into the buffers for phic/phi1/phi2/phi3, and each of phic/phi1/phi2/phi3 is shifted up by V3. The output for phic/phi1/phi2/phi3 is thus denoted with a "u", denoting a shift up in value as needed. The switches and circuitry shown in FIG. 12 represent an example implementation of this functionality.

Figure 13:
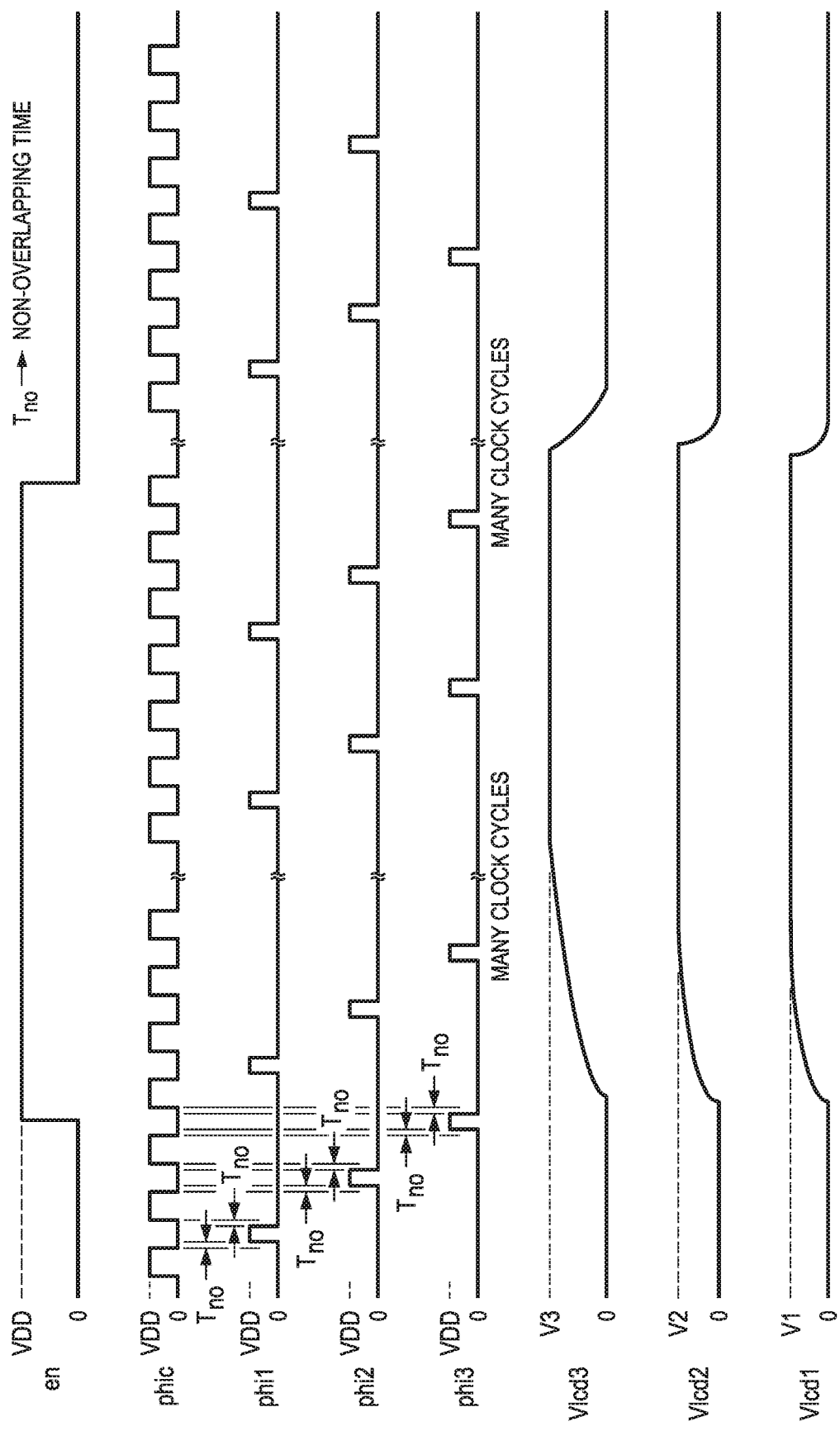
FIG. 13 is a timing diagram illustrating operation of the system, according to embodiments of the present disclosure.

FIG. 13 is a timing diagram illustrating operation of the system, according to embodiments of the present disclosure. Example signals for an enable, phic, phi1, phi2, phi3, and resulting intermediate signals VLCD1, VLCD2, and VLCD3 are shown. Non-overlapping time is denoted as "Tno".

Although specific examples have been shown in the present disclosure, variations, additions, subtractions, and rearrangements of the examples of the present disclosure may be made without departing from the spirit and scope of the present disclosure.

The invention claimed is:

1. A bias voltage generator circuit comprising:
   a mode control circuit;
   a clock generator circuit coupled with the mode control unit and configured to generate a plurality of clock signals; and
   a charge pump circuit configured to receive the clock signals, coupled with the mode control circuit, and further configured to output selectable output voltages according to input from the mode control circuit, the output selectable voltages to depend upon the clock signals, the clock signals to include non-overlapping pulses of a base signal and one or more phased signals.

2. The bias voltage generator circuit according to claim 1, wherein the phased signals are to be selected according to specified output of the charge pump circuit.

3. The bias voltage generator circuit according to claim 1, wherein the charge pump circuit is configured to output bias voltages based upon the presence of alternating ones of the phased signals.

4. The bias voltage generator circuit according to claim 1, wherein the charge pump circuit is configured to output a voltage based on a number of different phased signals.

5. The bias voltage generator circuit according to claim 1, wherein the charge pump circuit is configured to output a bias voltage with a current, the current based upon a number of different phased signals.

6. The bias voltage generator circuit according to claim 1, wherein the mode control circuit is configured to select between a plurality of operating modes to define output of the charge pump circuit.

7. The bias voltage generator circuit according to claim 6, wherein a first operating mode is configured to provide for a bias voltage with a first current for an LCD and a second operating mode is configured to provide the bias voltage with a second current for the LCD.

8. A microcontroller comprising:
   a bias voltage generator circuit; and
   an output routing circuit, the output routing circuit configured to route output from the bias voltage generator circuit to a display;
   wherein the bias voltage generator circuit comprises:
      a mode control circuit;
      a clock generator circuit coupled with the mode control unit and configured to generate a plurality of clock signals; and
      a charge pump circuit configured to receive the clock signals, coupled with the mode control circuit, and operable to output selectable output voltages according to input from the mode control circuit, the output selectable voltages to depend upon the clock signals, the clock signals to include non-overlapping pulses of a base signal and one or more phased signals.

9. The microcontroller according to claim 8, wherein the phased signals are to be selected according to specified output of the charge pump circuit.

10. The microcontroller according to claim 8, wherein the charge pump circuit is configured to output bias voltages based upon the presence of alternating ones of the phased signals.

11. The microcontroller according to claim 8, wherein the charge pump circuit is configured to output a voltage based on a number of different phased signals.

12. The microcontroller according to claim 8, wherein the charge pump circuit is configured to output a bias voltage with a current, the current based upon a number of different phased signals.

13. The microcontroller according to claim 8, wherein the mode control circuit is configured to select between a plurality of operating modes to define output of the charge pump circuit.

14. The microcontroller according to claim 13, wherein a first operating mode is configured to provide for a bias voltage with a first current for an LCD and a second operating mode is configured to provide the bias voltage with a second current for the LCD.

15. A method, comprising:
   generating a plurality of clock signals; and
   outputting selectable output voltages according to input from a mode control circuit, the output selectable voltages to depend upon the clock signals, the clock signals including non-overlapping pulses of a base signal and one or more phased signals.

16. The method according to claim 15, wherein the phased signals are selected according to specified output of the charge pump circuit.

17. The method according to claim 16, wherein:
   in a first operating mode, providing a bias voltage with a first current for an LCD; and
   in a second operating mode, providing the bias voltage with a second current for the LCD.

18. The method according to claim 15, further comprising outputting bias voltages based upon the presence of alternating ones of the phased signals.

19. The method according to claim 15, further comprising outputting a voltage based on a number of different phased signals.

20. The method according to claim 15, further comprising outputting a bias voltage with a current, the current based upon a number of different phased signals.

21. The method according to claim 15, further comprising selecting between a plurality of operating modes defining output of the output voltages.

22. A method, comprising:
   providing a mode control circuit;
   with a clock generator circuit coupled with the mode control unit, generating a plurality of clock signals;
   with a charge pump circuit coupled with the mode control circuit:
      receiving the clock signals; and
      outputting selectable output voltages according to input from the mode control circuit, wherein the output selectable voltages depend upon the clock signals; and
   providing a bootstrap circuit coupled between the clock generator circuit and the charge pump circuit.

23. A method, comprising:
   generating a plurality of clock signals;
   outputting selectable output voltages according to input from a mode control circuit, the output selectable voltages to depend upon the clock signals, the clock signals including non-overlapping pulses of a base signal and one or more phased signals;
   in a first operating mode, providing a bias voltage for a 3V LCD; and
   in a second operating mode, providing a bias voltage for a 5V LCD.

24. A method, comprising:
   generating a plurality of clock signals;

outputting selectable output voltages according to input from a mode control circuit, the output selectable voltages to depend upon the clock signals, the clock signals including non-overlapping pulses of a base signal and one or more phased signals;

outputting a first voltage based upon the presence of a first number of different phased signals; and outputting a second voltage based upon the presence of a second number of different phased signals;

wherein:

the second voltage is higher than the first voltage; and the second number of different phased signals is greater than the first number of different phased signals.

* * * * *